United States Patent [19]

Hori et al.

[11] Patent Number: 5,153,526
[45] Date of Patent: Oct. 6, 1992

[54] NUMERICAL CONTROL TYPE OSCILLATOR APPARATUS

[75] Inventors: Katsuya Hori, Kanagawa; Eiichiro Morinaga, Tokyo, both of Japan

[73] Assignee: Sony Corporation, Tokyo, Japan

[21] Appl. No.: 704,360

[22] Filed: May 23, 1991

[30] Foreign Application Priority Data

May 31, 1990 [JP] Japan .................. 2-143087

[51] Int. Cl.⁵ .................. H03B 19/00; H03K 3/04; H03L 7/00
[52] U.S. Cl. .................. 328/14; 307/271; 328/61
[58] Field of Search .......... 307/271; 328/14, 18, 328/155, 61

[56] References Cited

U.S. PATENT DOCUMENTS

| | | | |
|---|---|---|---|
| 3,824,498 | 7/1974 | McBride | 331/107 DP |
| 4,652,832 | 3/1987 | Jasper | 328/14 |
| 4,901,265 | 2/1990 | Kerr et al. | 328/14 |

FOREIGN PATENT DOCUMENTS

0312370A2 4/1989 European Pat. Off. .

OTHER PUBLICATIONS

Research Disclosure, No. 316, Aug. 1990, Emsworth, p. 646; Tran Thong: "Increased Frequency Resolution Digital Signal Generator".

Patent Abstracts of Japan, vol. 6, No. 185 (E-132)(1063), Sep. 21, 1982 and JP-A-57 99 007 (Fujitsu K.K.) Jun. 19, 1982.

*Primary Examiner*—Stanley D. Miller
*Assistant Examiner*—Sinh N. Tran
*Attorney, Agent, or Firm*—Philip M. Shaw, Jr.

[57] ABSTRACT

A numerical control type oscillator whose output oscillation frequency is controlled depending on input numerical data, comprises: first accumulation means for accumulating a first set value which is set depending on the input numerical data with a first frequency and sequentially outputting the accumulated value; second accumulation means for accumulating a second set value which is set depending on the input numerical data with a second frequency and varying the first set value by a predetermined value temporarily when the accumulated value reaches a predetermined maximum value; and frequency generation means for outputting a frequency depending on an output of the first accumulation means as an oscillation frequency.

6 Claims, 2 Drawing Sheets

NUMERICAL CONTROL TYPE OSCILLATOR APPARATUS

BACKGROUND OF THE INVENTION

1. Field of the Invention

The present invention relates to a numerical control type oscillator whose oscillation frequency is controlled depending on set data.

2. Description of the Prior Art

A numerical control type oscillator (NCO) is an oscillator whose oscillation frequency is controlled depending on set data. Such a numerical control type oscillator is used to provide a signal synchronized with a carrier wave of a signal sent from a communication satellite, for example.

Clearly, in FIG. 1, an electric wave from the communication satellite is received at an antenna 41. The carrier frequency of the signal sent from the communication satellite may by varied due to the Doppler effect. The reception signal is converted into a predetermined frequency at a converter 42 which is provided near the antenna 41. The signal from the converter 42 is supplied to a down-converter 43. The signal is converted into an intermediate frequency signal with a predetermined frequency of several MHz at the down-converter 43.

The output of the down-converter 43 is supplied to a phase comparator 44. The output of a numerical control type oscillator 45 is also fed to the phase comparator 44. A phase comparison of the carrier wave from the down-converter 43 and the output of the numerical control type oscillator 45 is made at the phase comparator 44. The phase comparison output is given to an A/D converter 47 through a low-pass filter 46. The output of the A/D converter 47 is supplied to the numerical control type oscillator 45. The oscillation frequency of the numerical control type oscillator 45 is controlled depending upon the output data of the A/D converter 47.

As a result, a signal synchronized with the carrier frequency can be provided from the numerical control type oscillator 45.

FIG. 2 shows a structure of a conventional numerical control type oscillator used for such a PLL circuit.

In FIG. 2, reference numeral 51 is a controller for setting a frequency. A frequency setting value N depending on the output data of the A/D converter 47 is given to the controller 51. The frequency setting value N is fed to a frequency setting register 52.

The output of the frequency register 52 is supplied to an adder 53. The output of the adder 53 is given to an address register 54. The output of the address register 54 is supplied back to the adder 53.

A clock of a frequency $F_c$ is given to the address register 54 from a clock generator 55. The output of the frequency setting register 52 is sequentially accumulated at the adder 53 and the address register 54.

The output of the address register 54 is supplied to an address of a waveform generating ROM 56. Waveform data of one period is stored for an address of $2^i$, for example, at the waveform generating ROM 56.

The waveform data is produced from the waveform generating ROM 56 according to an address from the address register 54. The output of the waveform generating ROM 56 is supplied to a D/A converter 57. At the D/A converter 57, the waveform data from the waveform shaping ROM 56 is converted into an analog waveform. The analog waveform is taken out of an output terminal 58.

When the frequency setting value is N, an address $A_k$ generated from the address register 54 is advanced every frequency setting value N with the clock $F_c$ by the adder 53 and the address register 54. With the address $A_k$ advanced to $2^i$, a signal of one period is generated. For this reason, the time for the address $A_k$ to be advanced to $2^i$ corresponds to the period of an oscillation output produced from the output terminal 58. The period $T_{NCO}$ is represented by $$T_{NCO} = \frac{2^i}{N} \cdot \frac{1}{F_c}$$

As a result, an oscillation frequency $F_{NCO}$ is given by: $F_{NCO} = F_c(N/2^i)$. Consequently, frequency accuracy $\Delta F_{NCO}$ of the conventional numerical control type oscillator is expressed by $$\Delta F_{NCO} = F_C \times (\tfrac{1}{2^i}).$$

In this way, in the conventional numerical control type oscillator, the accuracy of the oscillation frequency is represented by $$\Delta F_{NCO} = F_C \times (\tfrac{1}{2^i}).$$

Therefore, to improve the oscillation frequency accuracy, it is needed to elevate the clock oscillation frequency $F_C$ or to increase an address bit number i.

However, with the clock frequency $F_C$ increased, it is necessary to accumulate the setting value N at high speed and to shorten the delay time at the adder 53. However, there is a limit to the reduction of the delay time of the adder 53.

Also, with the address bit number i increased, the circuit size increases correspondingly.

OBJECTS AND SUMMARY OF THE INVENTION

It is, therefore, an object of the invention to provide a numerical control type oscillator capable of improving the frequency accuracy without increasing the circuit size.

According to an aspect of the invention, there is provided a numerical control type oscillator whose output oscillation frequency is controlled depending on input numerical data, comprising:

first accumulation means for accumulating a first set value which is set depending on the input numerical data with a first frequency and sequentially outputting the accumulated value;

second accumulation means for accumulating a second set value which is set depending on the input numerical data with a second frequency and varying the first set value by a predetermined value temporarily when the accumulated value reaches a predetermined maximum value; and frequency generation means for outputting a frequency depending on an output of the first accumulation means as an oscillation frequency.

A controller is provided to execute the process for accumulating a second frequency setting value L and changing a first frequency setting value N to (N+1) temporarily when the accumulated value B becomes a predetermined value $B_{max}$.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
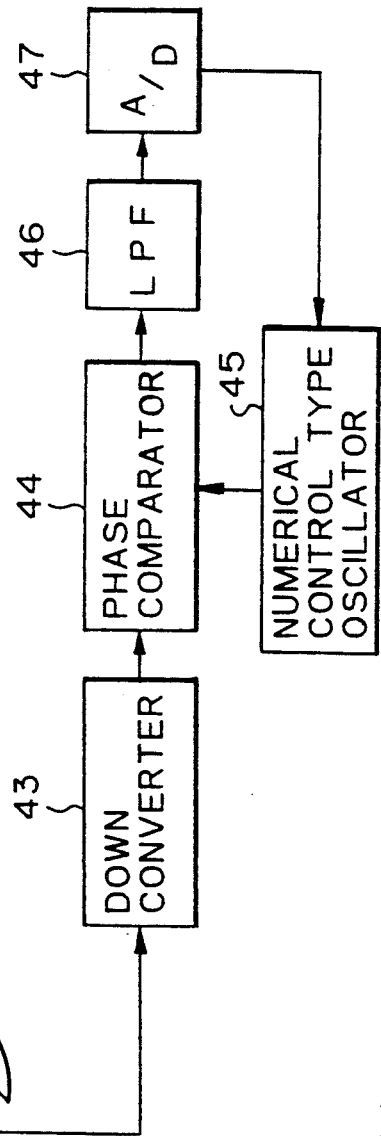
FIG. 1 is a block diagram for a conventional numerical control type oscillator.
Figure 2:
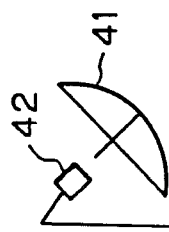
FIG. 2 is a block diagram of one example of a conventional numerical control type oscillator.
Figure 2:
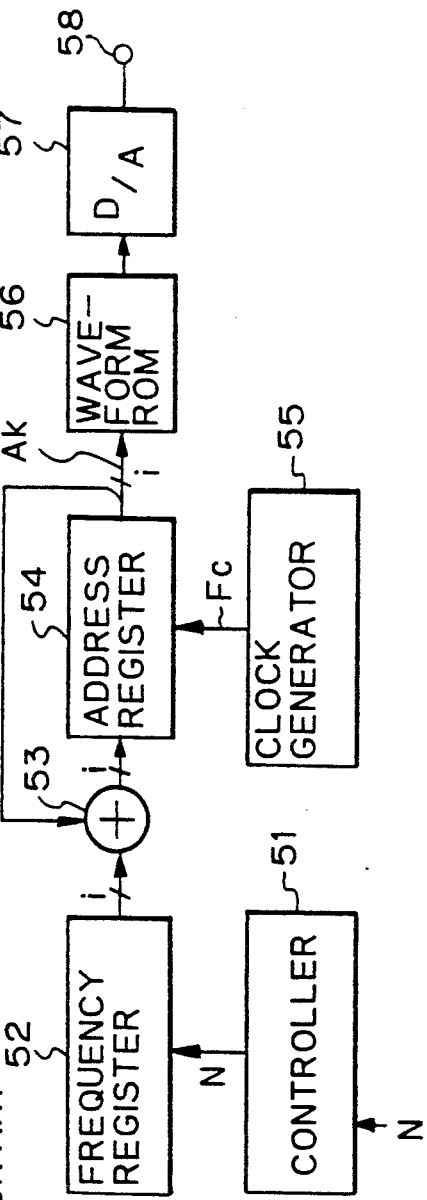

One embodiment of the invention will be described referring to the drawings.

Figure 3:
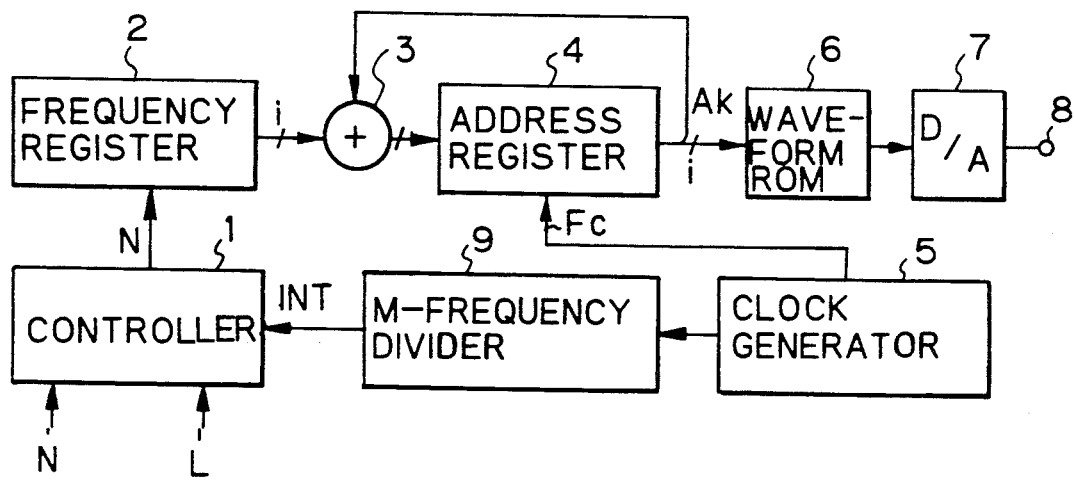
FIG. 3 is a block diagram of one embodiment of this invention.

FIG. 3 shows one embodiment of the invention. In FIG. 3, reference numeral 1 is a controller for setting a frequency. Frequency setting values N and L depending on the phase error component are given to the controller 1. The frequency setting value N is for setting a main oscillation frequency. The frequency setting value L is for setting a highly accurate frequency. The frequency setting value N is supplied to a frequency setting register 2.

A control program is provided at the controller 1 so that the frequency setting value L is accumulated with the supply of an interrupt signal from an M-frequency divider 9 and that as soon as the accumulated value B becomes a predetermined value $B_{max}$, the frequency setting value N, for example, is set at (N+1).

In detail, a clock of a frequency $F_C$ is generated from a clock generator 5. The clock is given to an interrupt terminal of the controller 1 through the M-frequency divider 9. In response to the application of this signal to the interrupt terminal of the controller 1, the controller 1 executes an interrupt processing as shown in FIG. 4.

Figure 4:
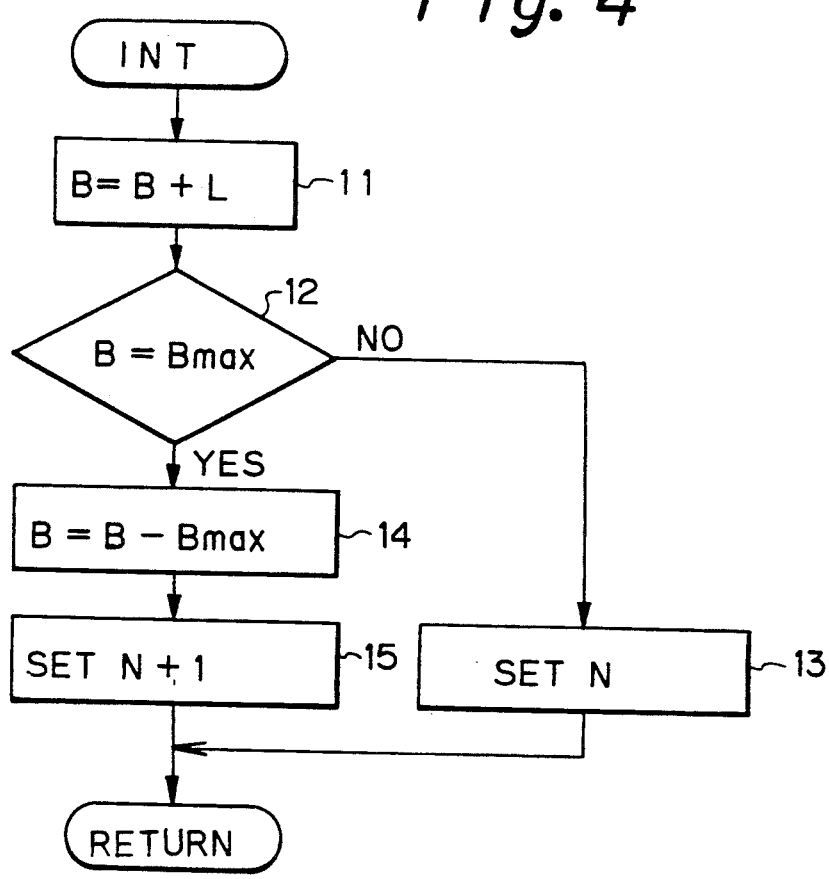
FIG. 4 is a flow chart for explaining one embodiment of the invention.

Clearly, in FIG. 4, the frequency setting value L is added with an accumulated value B to provide a new accumulated value B (step 11). The accumulated value B is set at 0 in the initial state.

A judgment is made on whether the accumulated value thus provided has reached a predetermined maximum value $B_{max}$ (step 12).

If the accumulated value B is less than the maximum value $B_{max}$, the frequency setting value set at the frequency setting register 2 is brought to N, and control is returned to a normal processing routine.

When the accumulated value B is equal to or larger than the maximum value $B_{max}$, the maximum value $B_{max}$ is subtracted from the accumulated value B, the value $(B - B_{max})$ is brought to a new accumulated value B (step 14).

Only at this time, the frequency setting value set at the frequency setting register 2 is changed to (N+1), and control is returned to a normal processing routine.

In FIG. 3, the output of the frequency register 2 is given to an adder 3. The output of the adder 3 is supplied to an address register 4. The output of the address register 4 is fed back to the adder 3.

To the address register 4 is given a clock of the frequency $F_c$ from the clock generator 5. The output of the frequency register 2 is sequentially accumulated at the adder 3 and the address register 4.

The output of the address register 4 is also given to an address of a waveform generating ROM 6. Data of one period is stored for an address of $2^i$, for example, at the waveform generating ROM 6.

Waveform data is output from the waveform generating ROM 6 according to an address from the address register 4. The output of the waveform generating ROM 6 is supplied to a D/A converter 7. The waveform data from the waveform generating ROM 6 is converted into an analog waveform at the D/A converter 7. The analog waveform is produced from an output terminal 8.

In one embodiment of the invention, the controller 1 is provided to have a program for accumulating the frequency setting value L every output from the M-frequency divider 9 and bringing the frequency setting value to (N+1) temporarily when the accumulated value B reaches the predetermined value $B_{max}$. Therefore, frequencies between N and (N+1) can be expressed, so that the frequency accuracy can be enhanced.

Namely, an address $A_k$ generated from the address register 4 is advanced every frequency setting value N with the clock $F_c$ by the adder 3 and the address register 4. Also, each time the accumulated value B of the frequency setting value L reaches the predetermined value $B_{max}$, the frequency setting value N is set at (N+1) temporarily.

Since waveform data of one period is stored into the address of $2^i$ at the wave form generating ROM 6, the time for the address Ak generated from the address register 4 to be advanced to $2^i$ corresponds to the period of an output signal from the waveform generating ROM 6.

Therefore, an oscillation frequency $F_{NCO}$ produced from an output terminal 8 is $$F_{NCO} = F_c \left( \frac{N}{2^i} + \frac{1}{2^i} \cdot \frac{L}{B_{max}} \right)$$

As a result, the accuracy of the frequency accuracy $\Delta F_{NCO}$ is $$\Delta F_{NCO} = F_c \left( \frac{1}{2^i} + \frac{1}{B_{max}} \right)$$

As mentioned above, according to the invention, the controller is provided to execute the processing for accumulating the second frequency setting value L and changing the first frequency setting value N to (N+1) temporarily when the accumulated value B reaches the predetermined value $B_{max}$. Consequently, the frequency accuracy of $(1/B_{max})$ can be obtained as compared with the conventional one, and the frequency accuracy can be enhanced without increasing the circuit size.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A numerical control type oscillator whose output oscillation frequency is controlled depending on input numerical data, comprising:

first accumulation means, responsive to the input numerical data and a clock signal of a first frequency, for accumulating a first set value which is set depending on the input numerical data and the clock signal of the first frequency, and sequentially outputting the accumulated first set value;

second accumulation means, supplied with the input numerical data and a signal of a second frequency and connected to control the first accumulation means, for accumulating a second set value which is set depending on the input numerical data and the second frequency, determining whether the accumulated second set value is less than a predetermined maximum value, and varying the first set value by a predetermined value temporarily when the accumulated second set value reaches the predetermined maximum value; and frequency generation means, operatively connected to the first accumulation means and supplied with the first set value, for outputting an oscillation frequency corresponding to the first set value.

2. A numerical control type oscillator according to claim 1, wherein in the second accumulation means, a differential value between the accumulated second set value and the maximum value is set to a new accumulated value when the accumulated second set value reaches the maximum value.

3. A numerical control type oscillator according to claim 2, wherein the second accumulation means sets the accumulated second set value to 0 at the time of starting of the operation.

4. A numerical control type oscillator according to claim 1, further comprising means, supplied with the clock signal of the first frequency, for generating the signal of the second frequency by dividing the clock signal of the first frequency and supplying the signal of the second frequency to the second accumulation means.

5. A numerical control type oscillator according to claim 1, wherein the frequency generation means includes a memory which stores each value of a waveform data of a period obtained by dividing by a time base in each address and the first set value output by the first accumulation means is used as each address.

6. A numerical control type oscillator for generating a reference frequency which is controlled by a numerical value data depending on a phase error component of a reception frequency and wherein the phases of the reference frequency and the reception frequency are compared, comprising:

first accumulation means, responsive to the input numerical data and a clock signal of a first frequency, for accumulating a first set value which is set depending on the input numerical data and the clock signal of the first frequency, and sequentially outputting the accumulated first set value;

second accumulation means, supplied with the input numerical data and a signal of a second frequency and connected to control the first accumulation means, for accumulating a second set value which is set depending on the input numerical data and the second frequency, determining whether the accumulated second set value is less than a predetermined maximum value, and varying the first set value by a predetermined value temporarily when the accumulated second set value reaches the predetermined maximum value; and frequency generation means, operatively connected to the first accumulation means and supplied with the first set value, for outputting the reference frequency depending on the first set value.

\* \* \* \* \*